US005371802A

United States Patent [19]

McDonald et al.

[11] Patent Number: 5,371,802

[45] Date of Patent: Dec. 6, 1994

[54] SOUND SYNTHESIZER IN A VEHICLE

[75] Inventors: Anthony M. McDonald; David C. Quinn; David C. Perry, all of Norfolk, United Kingdom

[73] Assignee: Group Lotus Limited, United Kingdom

[21] Appl. No.: 111,022

[22] Filed: Aug. 24, 1993

Related U.S. Application Data

[63] Continuation of Ser. No. 768,227, Dec. 12, 1991, abandoned.

[30] Foreign Application Priority Data

Apr. 20, 1989 [GB] United Kingdom ................. 8908980

[51] Int. Cl.[5] .............................................. H03B 29/00

[52] U.S. Cl. ......................................... 381/71; 381/86; 381/110; 455/297

[58] Field of Search ........................... 381/71, 86, 110; 340/683; 367/197, 198, 199; 455/297

[56] References Cited

U.S. PATENT DOCUMENTS

| | | | |
|---|---|---|---|
| 3,158,835 | 11/1964 | Hipkins | 381/86 |
| 4,219,962 | 9/1980 | Dankman et al. | 46/232 |
| 4,274,225 | 6/1981 | Knauff et al. | 46/227 |
| 4,289,307 | 9/1981 | Marshall, Jr. et al. | 272/52.5 |
| 4,525,870 | 6/1985 | Fukuhara et al. | 455/297 |
| 4,750,888 | 6/1988 | Allard et al. | 434/69 |
| 5,073,944 | 12/1991 | Hirasa | 381/86 |
| 5,097,923 | 3/1992 | Ziegler et al. | 381/71 |

FOREIGN PATENT DOCUMENTS

| | | |
|---|---|---|
| 2734948 | 2/1979 | Germany . |
| 3420463A1 | 12/1985 | Germany . |
| 2018144A | 10/1979 | United Kingdom . |
| 88/02912 | 4/1988 | WIPO . |

*Primary Examiner*—John K. Peng
*Assistant Examiner*—Edward Lefkowitz
*Attorney, Agent, or Firm*—Fulwider Patton Lee & Utecht

[57] ABSTRACT

In a noise enhancement system for use in a vehicle having an engine, a memory contains stored data representing desired sound relating to vehicle speed or the engine speed. The system is provided with a source of first signals indicative of the vehicle speed or the engine speed and a generator to generate vehicle engine noise desired by an occupant of a cabin of the vehicle. The generator includes a synthesizer to synthesize desired vehicle engine noise signals used to generate the desired vehicle engine noise and a microprocessor responsive to the first signals to use appropriate data of the stored data in dependence upon the vehicle speed or the engine speed indicated by the first signal to control the synthesizer to synthesize the desired engine noise in time with the vehicle speed or the engine speed indicated by the first signals.

10 Claims, 2 Drawing Sheets

SOUND SYNTHESIZER IN A VEHICLE

Figure 1:
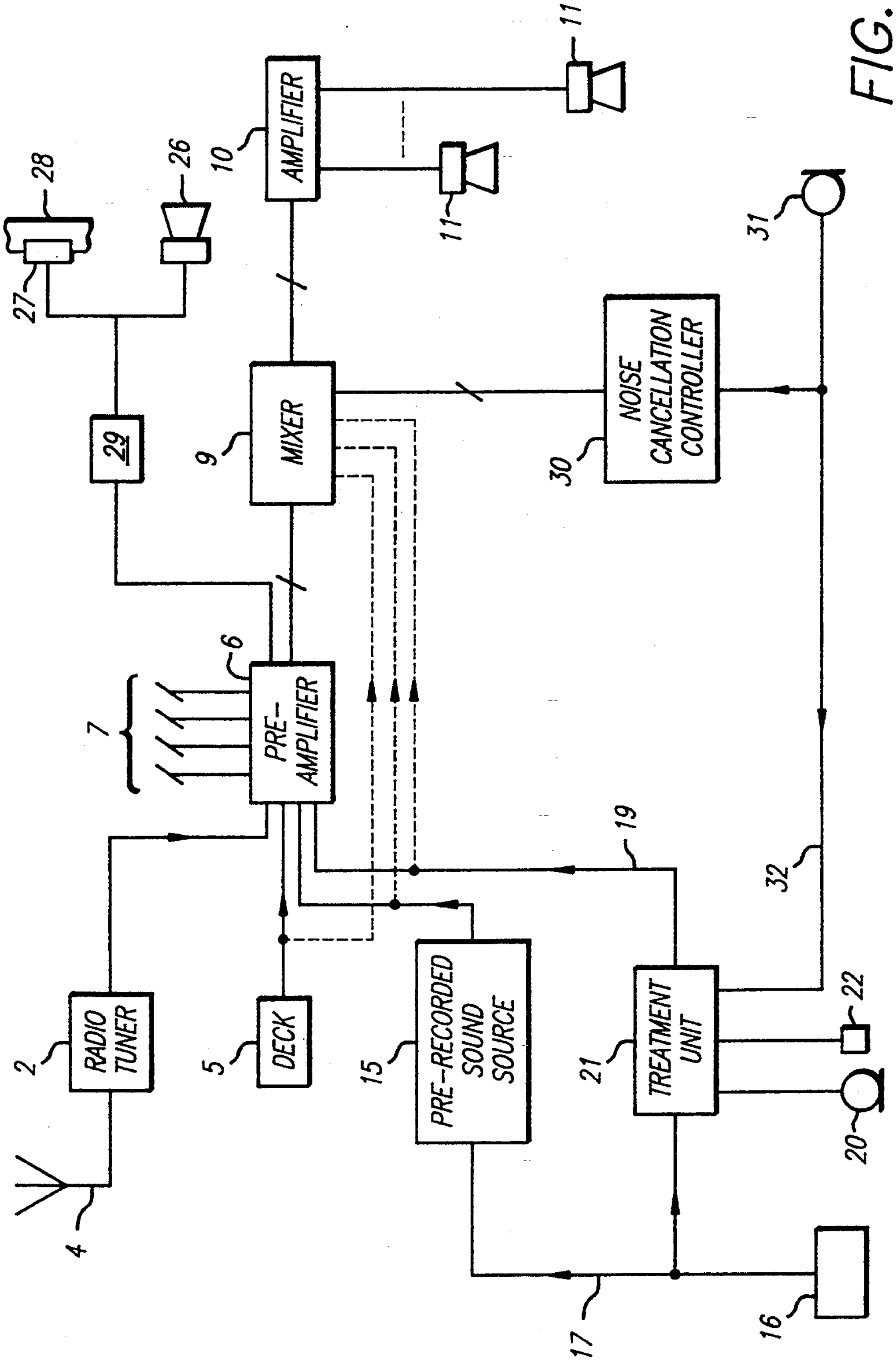

This application is a continuation of application Ser. No. 07/768,227, filed Dec. 12, 1991, now abandoned.

DESCRIPTION

The invention relates to the treatment of noise in vehicles, in particular road vehicles.

The driver and passengers in the cabins of conventional passenger cars are exposed to a great deal of externally generated noise, due primarily to the vehicle engine. Various proposals have been made for reduction of such ambient noise but the present invention is concerned with the enhancement of the vehicle noise experienced by the cabin occupants during normal driving conditions.

According to the invention, there is provided a noise enhancement system for use in a vehicle, the system comprising a source of signals representing desired sound related to vehicle operation, and means selectively operable and/or responsive to vehicle operation or experience to apply the signals to one or more loudspeakers or other transducers or vibration actuators so as to create for occupants of the vehicle a desired sound experience.

The source of the signals representing desired sound can be a prerecorded source and/or one or more transducers responsive to noise or to operation of the vehicle or its engine. The transducer means can thus comprise for example one or more microphones or vibration sensors, preferably associated with signal treatment means. The transducer outputs can thus be simply shaped to provide the desired sound. Instead, the signals providing the desired sound can be obtained from a microprocessor-controlled synthesizer to which the transducer output is supplied, this output being employed to trigger the synthesizer to provide the desired signals at appropriate times. One or more microphones can be located in the vehicle cabin to provide feedback to the signal treatment means. The microprocessor controlling a synthesizer can store signals representing a desired sound to which the synthesizer can be arranged to adapt the transducer output.

The sounds heard by the user of a system embodying the invention can represent for example the sounds of a racing car or other high-performance road vehicle. The system can then be such that these sounds are heard by the cabin occupants whilst the vehicle is being driven, so as to enhance the occupants driving experience.

in particular, the sounds of a high powered engine undergoing sharp acceleration can be produced in response to acceleration of a vehicle fitted with the system of the invention in ordinary driving conditions. The system can be responsive for example to gear changes and/or throttle movement. The sounds need not be limited to engine noise; for example a warning sound, for example, the siren of a police car can be produced when a predetermined vehicle engine speed is exceeded.

The one or more loudspeakers and/or one or more vibration actuators of the system are typically located in the vehicle cabin but instead or as well one or more loudspeakers or actuators can be positioned in the engine compartment, or on appropriate engine or body parts to effect or to modify vibration thereof, so that the sound from them is heard by the vehicle cabin occupants, and by persons outside the vehicle by the same route as sound from the vehicle engine.

Although the system of the invention can stand alone, it is conveniently integrated with the in-car-entertainment (I.C.E) systems now typically provided in passenger cars. The vehicle operation related sound can be integrated with entertainment sound but is preferably produced in alternation with it, either selectively or according to vehicle operation; for example the former may be heard during acceleration only, giving way to entertainment sound once cruising speed has been reached. The system of the invention can also be integrated with an active noise reduction system which can reduce ambient noise by generating within the vehicle cabin sound vibrations of phase and amplitude such as to cancel or reduce unwanted noise. Noise reduction can thus be operative to prevent interference with the desired sound related to vehicle operation, as well as with entertainment sound, or it may be operative only as long as entertainment sound is being produced or when an integrated system is otherwise out of use.

Figure 2:
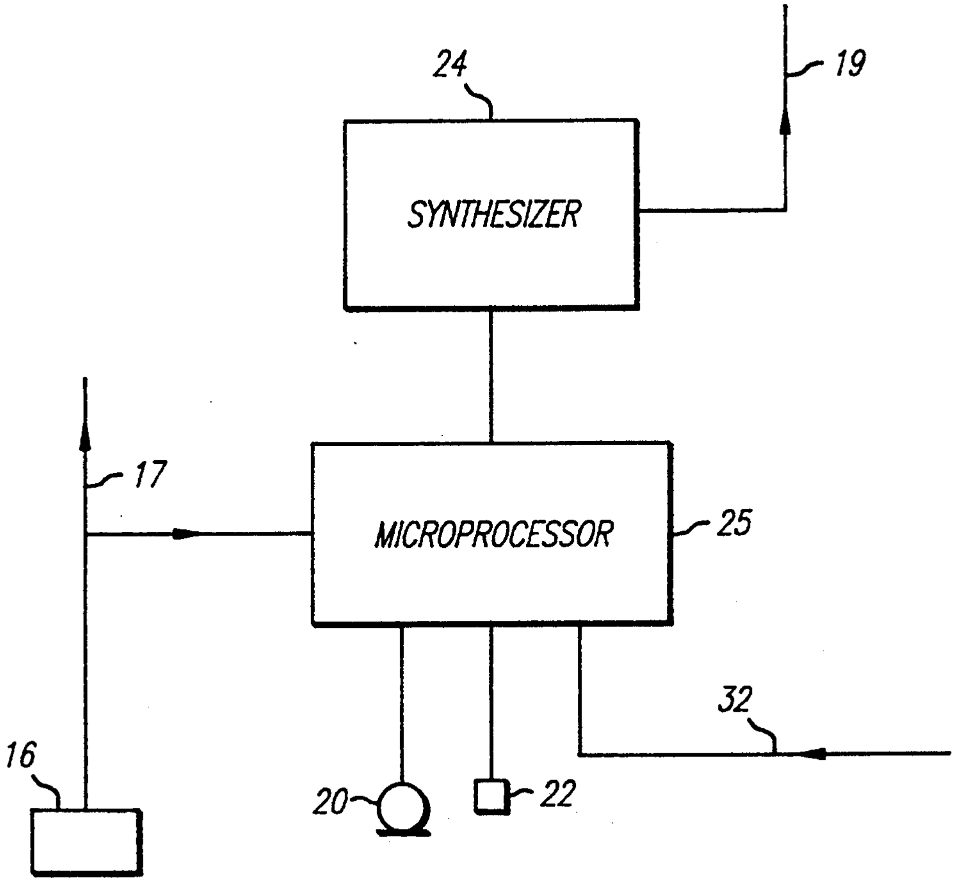

The invention is further described below, by way of example, with reference to the accompanying drawing in which:

FIG. 1 is a block circuit diagram of a combined audio entertainment and noise control or processing system embodying the invention; and FIG. 2 shows part only of a modified form of the system of FIG. 1.

The system illustrated in FIG. 1 is an integrated system comprising all the components necessary to provide in the cabin of a passenger motor car one or more of enhanced vehicle operation noise, audio entertainment, and ambient noise reduction, as the operator of the system may desire.

The in-car entertainment (I.C.E.) components of the system comprise an audio signal source constituted by at least one of a radio tuner 2 connected to an aerial 4, and a deck or decks 5 for playing one or more of compact discs, digitally recorded tapes or cassettes. The outputs from the tuner 2 and deck or decks 5 are fed to a pre-amplifier 6 fitted with conventional control arrangements 7 for signal source selection and for output adjustment, such as volume and bass and treble controls, or graphic equalization, and switching instruments to be described. These I.C.E. components will typically provide signals on a plurality N of output channels and balance and fader controls will then be provided. The pre-amplifier outputs are supplied by way of a mixer 9, preferably a balanced mixer, to power amplifier means 10 which powers one or more loudspeakers 11 operative in the vehicle cabin.

For enhanced vehicle sound production, the system includes a prerecorded sound source 15 which can comprise a deck of one or other of the types of deck mentioned with reference to the deck 5, but which need not have the usual facility for selective replacement of the signal storage medium. Operation of the source 15 is dependent on a control signal related to vehicle operation, typically throttle movement or gear changes, derived from a transducer 16 and supplied to the source on line 17, so that the source delivers signals representing the sounds of acceleration of a high powered vehicle, or other such desirable sounds, during acceleration or other operation of the vehicle in which the system is installed.

Instead of or as well as the source 15, the system includes one or more microphones 20 providing outputs representing actual vehicle engine noise or the operating noise of some other vehicle component, which is fed to the pre-amplifier 6, after treatment in a signal treatment unit 21. The signal treatment unit can comprise a relatively simple shaping circuit 21 where this can provide a satisfactory output to the pre-amplifier 6. Instead of or as well as the microphone or microphones 20, the system includes one or more transducers 22, for example vibration sensors, responsive to engine operation to provide signals to the preamplifier 6 after treatment in the signal treatment unit.

Instead of the shaping circuit 21, as shown in FIG. 2, the signal treatment unit can be constituted as a synthesizer 24 controlled by a micro-processor 25. The input from the or each microphone 20 or transducer 22 is then used to trigger the generation of a desired output from the synthesizer. Enhanced engine or vehicle interior noise is again provided, again preferably at times dependent on vehicle operation, as by control from the transducer 16.

The outputs of the source 15 and the signal treatment unit are supplied to the pre-amplifier 6 on line 19 for sound production in the vehicle cabin by way of the amplifier means 10 and the loudspeakers 11. In addition or instead the pre-amplifier output derived from the source 15 or the signal treatment unit can be used to drive one or more loudspeakers 26 located externally of the vehicle cabin, for example, in or near the engine compartment of the vehicle so as to enhance the sound actually produced by the vehicle engine, and/or a vibration actuator 27 operatively related to a vehicle panel 28. The loudspeaker 26 and/or actuator 27 is powered by way of one or more power amplifiers 29.

For noise reduction, the system includes an adaptive noise cancellation controller 30 which may advantageously be of the kind described in WO 88/02912, the contents of which are incorporated herein by reference. The controller 30 provides, on L channels, output signals derived from a reference signal by adaptive filtering carried out by a programmed microprocessor and memory unit in dependence on error signals from one or more microphones 31 . The microphones 31 may be inconspicuously located in the cabin and the reference signal may be derived directly from the vehicle engine, as described in WO 88/02912.

The output of the one or more microphones 31, or of one or more similarly located microphones if no noise reduction facilities are provided, can be fed back to the signal treatment unit 21 or to the microprocessor 25, on line 32, so as to provide adaptive control of the unit, as towards a predetermined enhanced noise signal defined in a memory in the unit or in the microprocessor.

The outputs from the pre-amplifier 6 and the controller 30 are fed to the balanced mixer 9 operative to provide outputs for the power amplifier means 10 combining a desired audio signal from one or other of the sources 2 and 5 together with a noise cancelling signals from the controller 30, on which the amplifier control arrangements 7 have no effect.

The system is provided with an on/off switch controlling the power amplifiers 10 and 29 and the mixer 9, and selector switches for selecting any one or more of the enhanced noise facility, the entertainment facility, and the noise reduction facility.

The loudspeakers 11 will conveniently match in number the number of the output channels of the pre-amplifier 6, but there may be M channels between the balanced mixer 12 and the amplifiers 10, where M is equal to or greater than the larger of the N entertainment channels or the L noise reduction channels.

One or more of the sources 5 and 15 and the unit 21 may incorporate a pre-amplifier and the output or outputs can then be supplied to the mixer 9 directly as indicated in the figure by broken lines.

It will be evident that the invention can be embodied in a variety of ways other than as herein described.

We claim:

1. A sound enhancement system for use in a vehicle having an engine, the system comprising a memory containing stored data representing desired sound related to one of vehicle speed and engine speed, a source of first signals indicative of one of vehicle speed and engine speed, and generating means for generating vehicle engine noise desired by an occupant of a cabin of the vehicle; said generating means including a synthesizer to synthesize desired vehicle engine noise signals used to generate said desired vehicle engine noise, and a microprocessor adapted to be responsive to said first signals and said stored data in dependence upon one of the vehicle speed and the engine speed indicated by said first signals to control said synthesizer to synthesize said desired vehicle engine noise signals in time with one of the vehicle speed and the engine speed indicated by said first signals.

2. A sound enhancement system as claimed in claim 1 wherein said source of first signals comprises at least one of:

at least one microphone responsive to vehicle engine noise;

at least one vibration sensor responsive to vehicle engine generated vibrations; and at least one transducer responsive to at least one of vehicle speed and engine speed.

3. A sound enhancement system as claimed in claim 1 wherein said vehicle includes an in-car entertainment system providing an audio signal source, the system including mixer means arranged to mix said desired vehicle engine noise signals and a signal from said audio signal source to generate a mix of said desired vehicle engine noise and sound from said audio signal source.

4. A sound enhancement system as claimed in claim 1 further including a noise cancellation system including at least one error sensing microphone, a signal treatment unit, means to supply signals output from said error sensing microphone to said signal treatment unit, said signal treatment unit being arranged to generate a noise canceling signal adaptively in response to the output from said error sensing microphone to reduce undesired noise, and mixer means arranged to mix said desired vehicle engine noise signals and said noise canceling signal to generate said desired vehicle engine noise.

5. A sound enhancement system as claimed in claim 1 including transducer means, and means to supply said desired vehicle engine noise signals from said generating means to said transducer means, said transducer means being arranged to receive said desired vehicle engine noise signals and generate vehicle engine noise desired by an occupant of the cabin of the vehicle.

6. A sound enhancement system as claimed in claim 5, wherein said transducer means comprises at least one of:

at least one loudspeaker located in the region of the vehicle engine;

at least one loudspeaker located in the vehicle cabin, and at least one vibration actuator arranged to cause a vehicle panel to vibrate.

7. A sound enhancement system as claimed in claim 5, wherein said transducer means comprises at least one loudspeaker located in the vehicle cabin, and said at least one loudspeaker forms part of at least one of an in-car entertainment system and a noise cancellation system.

8. A sound enhancement system as claimed in claim 1 wherein said source of first signals is adapted to provide signals indicative of both engine speed and throttle position, said memory is adapted to store data representing desired sound related to engine speed and throttle position, and said microprocessor is adapted to use said stored data in dependence upon the engine speed and the throttle position indicated by said first signals to control said synthesizer.

9. A sound enhancement system for use in a vehicle having an engine, the system comprising a source of first signals indicative of one of vehicle speed and engine speed, a memory containing stored data representing desired vehicle engine sound for vehicle speeds and engine speeds; transducer means; and generator means responsive to said first signals to use said stored data to provide desired vehicle engine noise signals to said transducer means to create enhanced vehicle engine noise within a cabin of the vehicle, said enhanced vehicle engine noise representing a sound desired by a cabin occupant; said generator means including a synthesizer to synthesize said desired vehicle engine noise signals, and a microprocessor responsive to said first signals and said stored data in dependence upon one of the vehicle speed and engine speed indicated by said first signals to control said synthesizer to trigger the generation of said desired vehicle engine noise signals in time with one of the vehicle speed and engine speed indicated by said first signals.

10. A sound enhancement system for use in a vehicle, the system comprising:

a memory containing stored data representing desired vehicle driving noise related to vehicle operation;

an audio signal source of an in-car entertainment system;

a source of speed signals indicative of one of vehicle speed and engine speed;

generating means responsive to said speed signals for converting said data to said vehicle driving noise desired by an occupant of the cabin of the vehicle; and mixer means arranged to mix said vehicle driving noise and a signal from said audio signal source to generate a mix of noise related to vehicle operation desired by the vehicle cabin occupant and sound from said audio signal source.

* * * * *